United States Patent
Douskey et al.

(10) Patent No.: US 9,297,856 B2
(45) Date of Patent: Mar. 29, 2016

(54) IMPLEMENTING MISR COMPRESSION METHODS FOR TEST TIME REDUCTION

(71) Applicant: International Business Machines Corporation, Armonk, NY (US)

(72) Inventors: Steven M. Douskey, Rochester, MN (US); Mary P. Kusko, Hopewell Junction, NY (US); Cédric Lichtenau, Stuttgart (DE)

(73) Assignee: International Business Machines Corporation, Armonk, NY (US)

( * ) Notice: Subject to any disclaimer, the term of this patent is extended or adjusted under 35 U.S.C. 154(b) by 101 days.

(21) Appl. No.: 14/060,744

(22) Filed: Oct. 23, 2013

(65) Prior Publication Data

US 2015/0113348 A1    Apr. 23, 2015

(51) Int. Cl.
*G01R 31/3185* (2006.01)
*G01R 31/317* (2006.01)

(52) U.S. Cl.
CPC .. *G01R 31/318547* (2013.01); *G01R 31/31703* (2013.01)

(58) Field of Classification Search
CPC ................................................ G01R 31/318547
See application file for complete search history.

(56) References Cited

U.S. PATENT DOCUMENTS

| | | | | |
|---|---|---|---|---|
| 5,572,712 A * | 11/1996 | Jamal | ............................. | 716/55 |
| 5,583,786 A * | 12/1996 | Needham | ...................... | 714/739 |
| 6,662,327 B1 | 12/2003 | Rajski | | |
| 6,678,707 B1 * | 1/2004 | Butler | ......................... | 708/250 |
| 6,950,974 B1 | 9/2005 | Wohl et al. | | |
| 7,512,851 B2 | 3/2009 | Wang et al. | | |
| 2003/0229886 A1* | 12/2003 | Hasegawa et al. | ............ | 717/115 |
| 2004/0153921 A1* | 8/2004 | Lee et al. | ...................... | 714/724 |
| 2006/0200719 A1* | 9/2006 | Keller | .......................... | 714/732 |
| 2009/0119559 A1* | 5/2009 | Foutz et al. | ................... | 714/729 |

OTHER PUBLICATIONS

Savir, J., "Shrinking wide compressors [BIST]," Computer-Aided Design of Integrated Circuits and Systems, IEEE Transactions on , vol. 14, No. 11, pp. 1379,1387, Nov. 1995.*

* cited by examiner

*Primary Examiner* — Steve Nguyen
(74) *Attorney, Agent, or Firm* — Joan Pennington

(57) ABSTRACT

A method and circuits for implementing multiple input signature register (MISR) compression for test time reduction, and a design structure on which the subject circuits reside are provided. The MISR compression circuit includes a first MISR, a second MISR provided with the first MISR, and a compressor to compress MISR data positioned in one of between the first MISR and second MISR and after the second MISR.

9 Claims, 12 Drawing Sheets

PRIOR ART

IMPLEMENTING MISR COMPRESSION METHODS FOR TEST TIME REDUCTION

FIELD OF THE INVENTION

The present invention relates generally to the data processing field, and more particularly, relates to a method and circuits for implementing Multiple Input Signature Register (MISR) compression methods for test time reduction, and a design structure on which the subject circuits reside.

DESCRIPTION OF THE RELATED ART

Some current custom designs have no MISR result compression, but rather read every multiple small MISR, often hundreds of them, upon test completion. Since MISRs are read many times during a suite of tests, testing can be very time consuming on an expensive tester, for example, more expensive than the test itself. Also note that while serial reading of the MISR is destructive, each MISR is still separable at the tester.

FIGS. 1, 2A, and 2B illustrate current designs including multiple MISRs used for testing. FIG. 1 illustrates a series or cascade arrangement of a plurality of MISRs 102 with a last MISR 102 in the string connected to chip pins 104.

FIGS. 2A, and 2B illustrate respective MISR arrangements 200, 220, each respectively including a plurality of MISRs 202, 222 provided to respective exclusive ORs (XORs). In FIG. 2A, the MISR arrangement 200 includes MISRs 202 having a 32 bits applied to respective XORs 204, 206, each having outputs applied to XORs 208 connected to chip pins 210. In FIG. 2B, the MISR arrangement 220 includes MISRs 222 having a 32 bits applied to respective XORs 224 that are series connected, with a last XOR 224 connected to chip pins 226. MISR arrangement 202, 220 busses the MISR32 bits with physically aware knowledge in an attempt to streamline the wiring, but this will result in even further delay Many current ASIC designs compress a single large MISR to a smaller number of observe outputs through an XOR tree. The measure is a simple observe measure versus the scan out required for the approach typically used in custom designs. While this makes for a quicker read, it can create a large wiring network which still has a multi-cycle delay that needs to be tuned at the tester. Additionally logic built-in self-test (LBIST) typically reads the entire large MISR.

A need exists for circuits having an efficient and effective mechanism for implementing Multiple Input Signature Register (MISR) compression methods for test time reduction.

SUMMARY OF THE INVENTION

Principal aspects of the present invention are to provide a method and circuit for implementing Multiple Input Signature Register (MISR) compression methods for test time reduction, and a design structure on which the subject circuit resides. Other important aspects of the present invention are to provide such method, circuits and design structure substantially without negative effects and that overcome many of the disadvantages of prior art arrangements.

In brief, a method and circuits for implementing multiple input signature register (MISR) compression for test time reduction, and a design structure on which the subject circuits reside are provided. The MISR compression circuit includes a first MISR, a second MISR provided with the first MISR, and a compressor to compress MISR data positioned in one of between the first MISR and second MISR and after the second MISR.

In accordance with features of the invention, the compressor includes an expect value and a compare.

In accordance with features of the invention, the compare of the compressor provides a pass/fail observe function.

In accordance with features of the invention, the compressor further includes an exclusive OR (XOR) block.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and circuits for implementing multiple input signature register (MISR) compression for test time reduction in accordance with a preferred embodiment; and a design structure on which the subject circuits resides are provided.

Having reference now to the drawings, in FIGS. 2C, 3A, 3B, 4A, 4B, 4C, 5, 6A and 6B there are shown respective example circuits for implementing multiple input signature register (MISR) compression methods for test time reduction in accordance with preferred embodiments.

Figure 1:
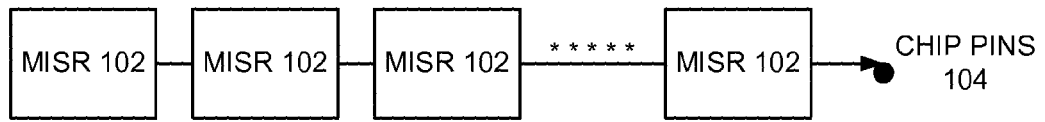
FIGS. 1, 2A, and 2B illustrate prior art designs including multiple MISRs used for testing.
Figure 2A:
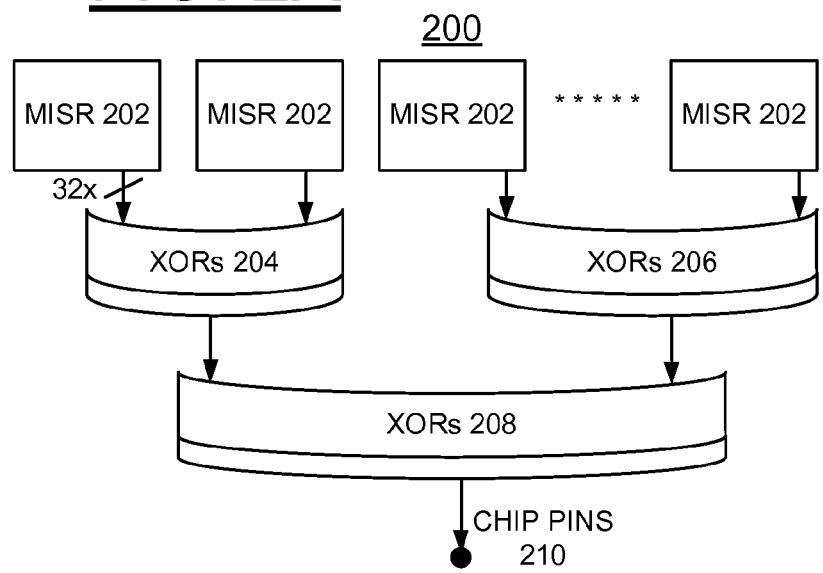
Figure 2B:
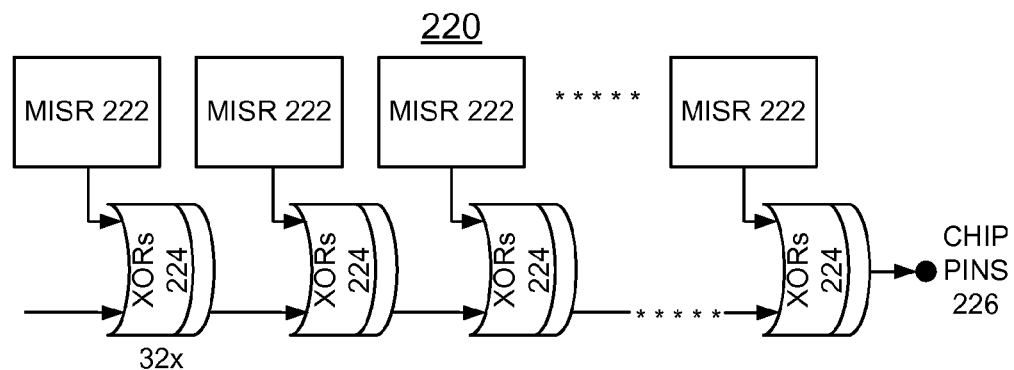
Figure 2C:
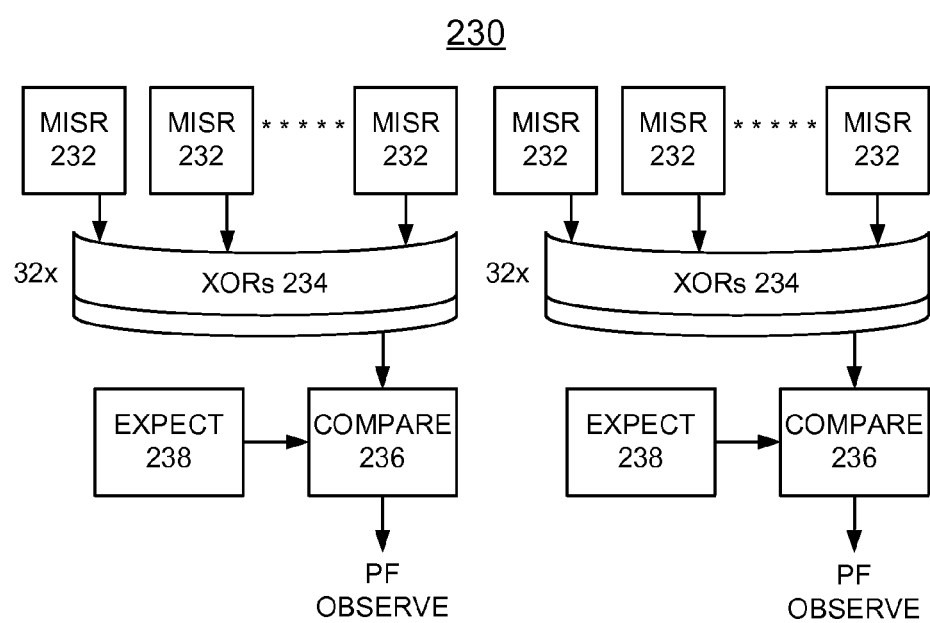
FIGS. 2C, 3A, 3B, 4A, 4B, 4C, 5, 6A and 6B respectively provide a schematic and block diagram representation illustrating example circuits for implementing multiple input signature register (MISR) compression for test time reduction and/or wiring reduction in accordance with preferred embodiments.

Referring to FIG. 2C, there is shown a MISR compression circuit generally designated by the reference character 230 in accordance with preferred embodiments. MISR compression circuit 230 includes a plurality of MISRs 232 divided into a pair of respective sections. Each of the MISRs 232 providing 32 inputs one each to a respective one of a pair of exclusive ORs (XORs) 234 having 32 bits applied to respective XORs 234.

In FIG. 2C, the MISR compression circuit 230 includes a respective compare function 236 and an expect function 238 provided with the respective XORs 234 in accordance with preferred embodiments. Providing the two expect functions 238 allows better timing and fewer global wires with the divided XORs 234 connected to the MISRs 232. Each compare function 236 is directly connected from a respective XOR 234 receiving the respective XOR output. Each compare function 236 provides a Pass/Fail test observe function, rather than a scan out operation of some conventional test arrangements.

Figure 3A:
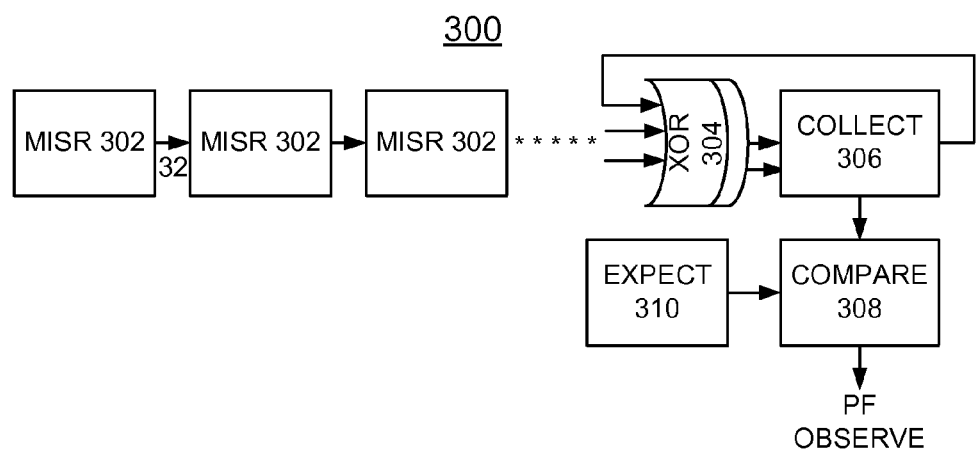

Referring to FIG. 3A, there is shown a MISR compression circuit generally designated by the reference character 300 in accordance with preferred embodiments. MISR compression circuit 300 includes a plurality of MISRs 302 connected in series or cascaded together with a last MISR 302 in the chain providing 32 inputs to 32 XORs 304. MISR compression circuit 300 includes a collect 306 receiving inputs from the XOR 304, a compare function 308 and an expect value 310. The collect 306 provides 32 feedback inputs to the 32 XORs 304 and provides 32 inputs to the compare function 308. MISR compression circuit 300 uses MISRs 302 as pipelining latches to aid in timing, but allows the compression of the MISRs at the scan cycle rate, so no tuning is needed during LBIST or at the tester. Note that for n MISRs 302 it will take n cycles to complete the compression.

Figure 3B:
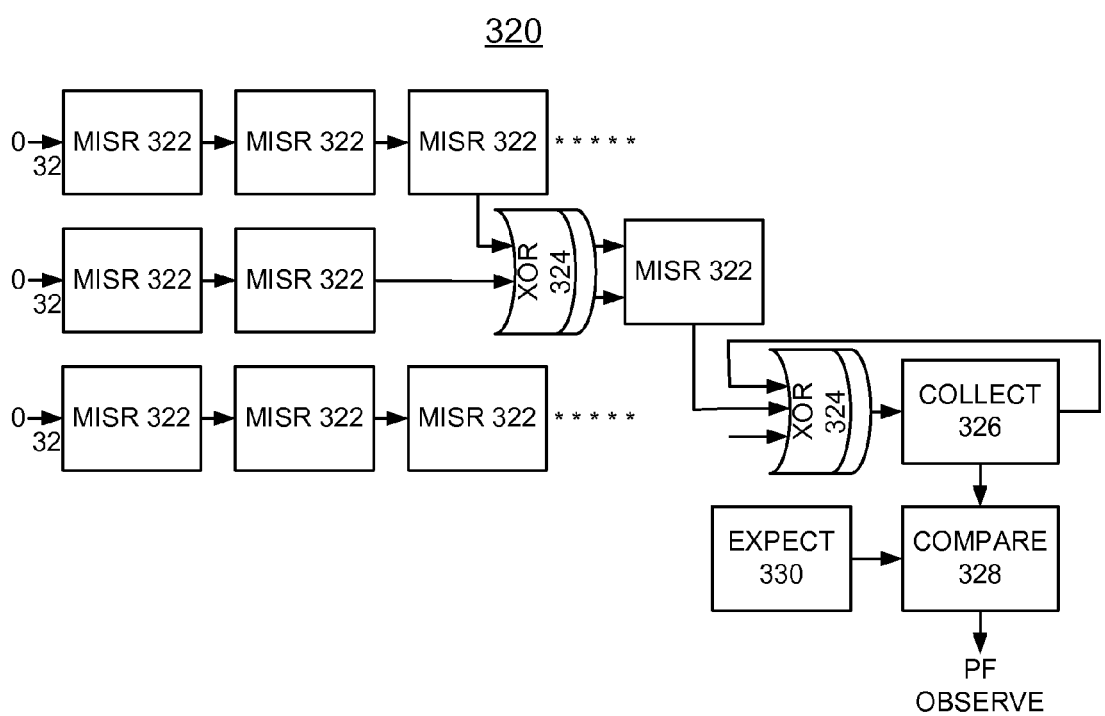

Referring to FIG. 3B, there is shown a MISR compression circuit generally designated by the reference character 320 in accordance with preferred embodiments. MISR compression circuit 320 includes a plurality of MISRs 322 connected in series or cascaded together with XORs 324 to tree the logic in places along the chain and a last MISR 322 in the chain providing inputs to an XOR 324 connected to a collect 326. MISR compression circuit 320 includes the collect 326 receiving 32 inputs from at least one or more XOR including the last XOR 324. MISR compression circuit 320 includes a compare function 328 and an expect value 330. The collect 326 provides 32 feedback inputs to the last XOR 324 and provides 32 inputs to the compare function 328. MISR compression circuit 320 uses MISRs 322 that may aid in wiring, but MISR compression circuit 320 is primarily advantageous for reducing the number of cycles for the results unload from the total MISR count to the depth of the tree. Note that the tops of all, but the longest depth MISR 322 need to have 0 inputs so that they compress correctly in MISR compression circuit 320.

Figure 4A:
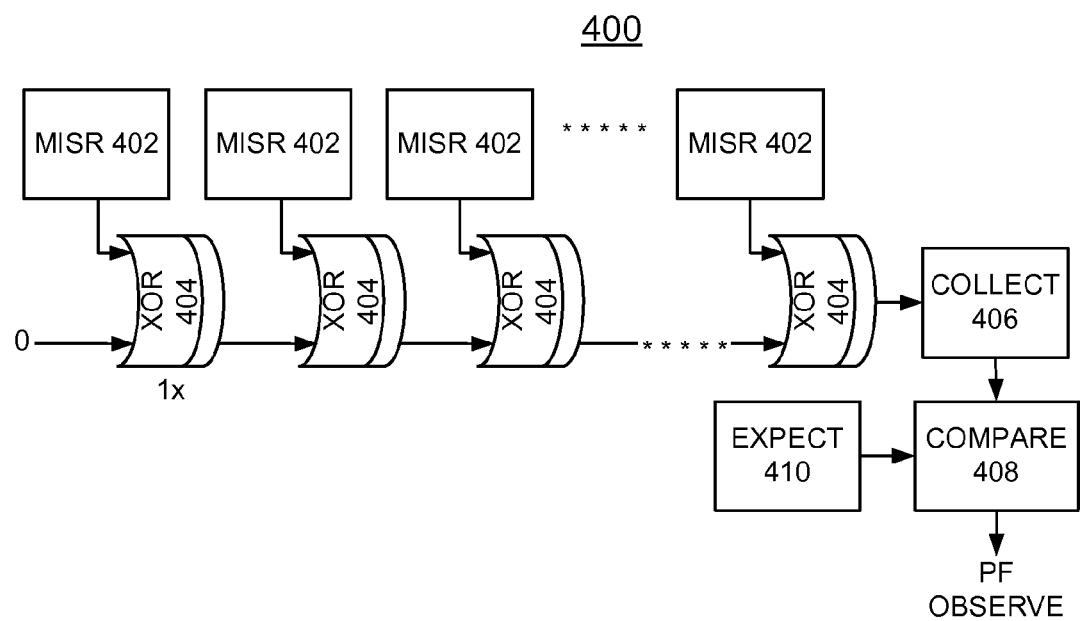

Referring to FIG. 4A, there is shown a MISR compression circuit generally designated by the reference character 400 in accordance with preferred embodiments. MISR compression circuit 400 includes a plurality of MISRs 402 each connected to a respective XOR 404. The plurality of XORs 404 is connected in a chain of XORs providing an input to a next XOR in the chain. MISR compression circuit 400 includes a collect 406 receiving inputs from the last XOR 404 in the chain, a compare function 408 and an expect value 410. The collect 406 provides 32 inputs to the compare function 408. As shown, MISR compression circuit 400 modifies the XOR tree structure and reduces the wiring by 32× by using the MISR 402 as a storage location, however MISR compression circuit 400 does not reduce timing. In MISR compression circuit 400 the final bit of every MISR is XORed and shifted into the collect 406. After 32 cycles of collection the final result is the same as the tree structure and can be compared with expected results with the compare 408 providing a Pass/Fail test observe function.

Figure 4B:
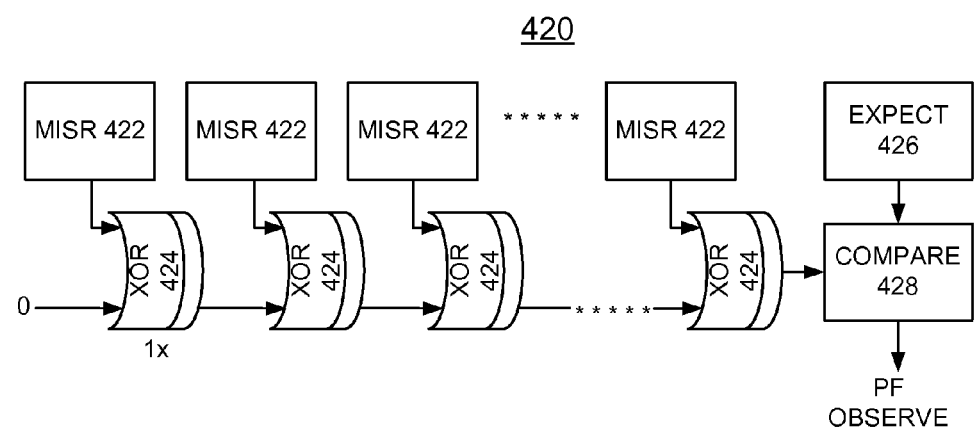

Referring to FIG. 4B, there is shown a MISR compression circuit generally designated by the reference character 420 in accordance with preferred embodiments. MISR compression circuit 420 includes a plurality of MISRs 422 each connected to a respective XOR 424. The plurality of XORs 424 is connected in a chain of XORs providing inputs to a next XOR in the chain. MISR compression circuit 420 includes a compare function 428 receiving inputs from the last XOR 424 in the chain, and an expect value 426. As shown, MISR compression circuit 420 removes the collector 406 of circuit 400 and allows the compare one bit at a time as the data is being moved out from each MISR 422. This can result in 32 bits serially to a pin for tester compare, or collected in a single pass/fail latch.

Figure 4C:
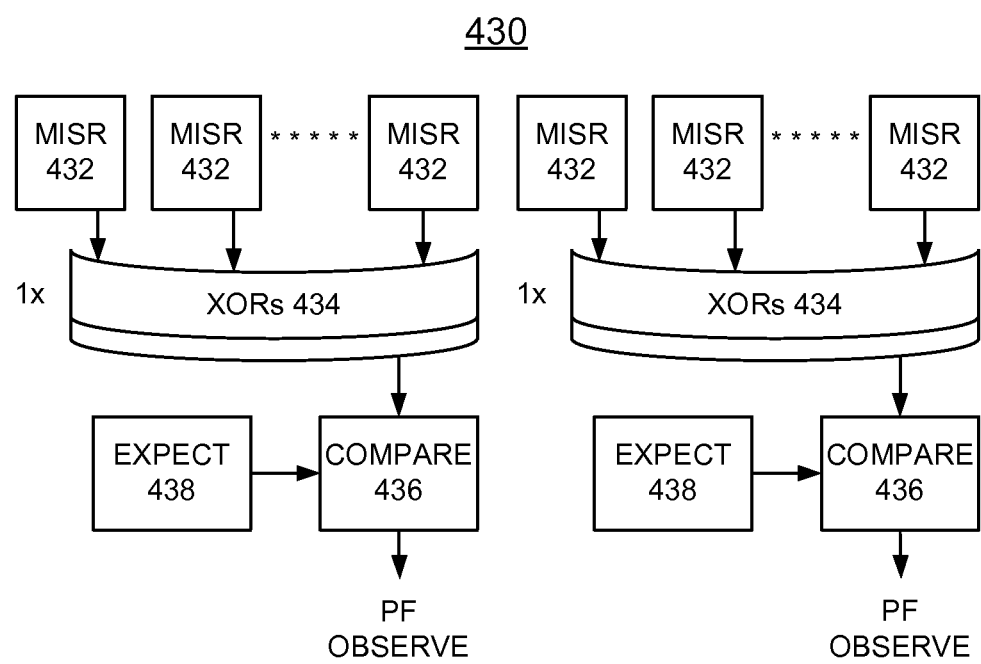

Referring to FIG. 4C, there is shown a MISR compression circuit generally designated by the reference character 430 in accordance with preferred embodiments. MISR compression circuit 430 partitions the circuits 400, 420 similar to circuit 230 shown in FIG. 2C. MISR compression circuit 430 includes a plurality of MISRs 432 divided into a pair of respective sections. Each of the MISRs 432 providing an input to a respective one of a pair of exclusive ORs (XORs) 434 having a 1 bits applied to respective XORs 434.

In FIG. 4C, the MISR compression circuit 430 includes a respective compare function 436 and an expect function 438 provided with the respective XORs 434 in accordance with preferred embodiments. Providing the two expect functions 438 allows better timing and fewer global wires with the divided XORs 434 connected to the MISRs 432. Each compare function 436 is directly connected a respective XOR 434 receiving the respective XOR output. Each compare function 436 provides a Pass/Fail test observe function, rather than a scan out operation of some conventional test arrangements.

In the MISR compression circuits 400, 420, 430 the MISRs 402, 422, 432 can be nondestructive as they data can be looped back and reloaded as it is shifted out. And the MISR compression circuits 400, 420, 430 result in the same predicted result as the XOR tree.

Figure 5:
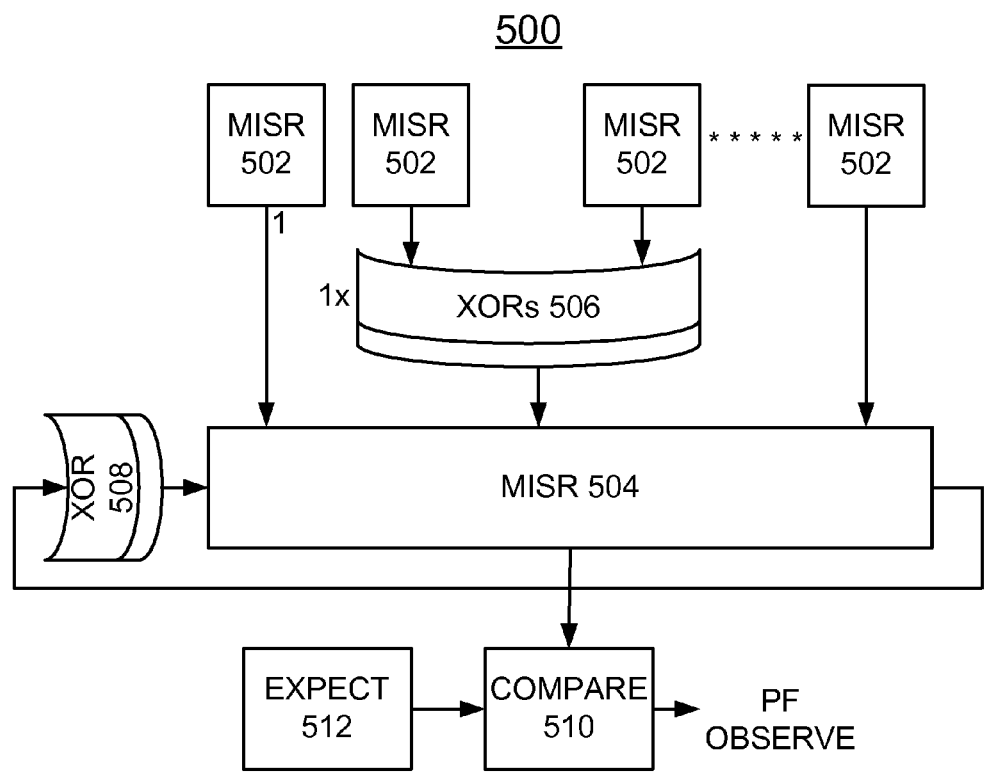

Referring to FIG. 5, there is shown a MISR compression circuit generally designated by the reference character 500 in accordance with preferred embodiments. MISR compression circuit 500 includes a plurality of MISRs 502 with a first and last MISR 502 connected to a MISR 504, and each of the other MISRs 502 connected to the MISR 504 directly or via respective XORs 506. The MISR 504 provides a feedback output for providing a feedback input via an XOR 508. The MISR compression circuit 500 includes a compare function 510 and an expect value 512. The MISR 504 provides 32 inputs to the compare function 510. As shown, MISR compression circuit 500 shows that the collection mechanism MISR 504 can also be direct from a MISR 502 and XOR 506 of MISRs 502. In MISR compression circuit 500 the last bit of each MISR is loaded for 32 cycles like MISR compression circuit 400 of FIG. 4A, however this final compression can be added to other MISR compression circuits in accordance with preferred embodiments. In the MISR compression method implemented by MISR compression circuit 500 is again nondestructive when the MISR loopback their values as they are unloaded. The MISR 504 can act as a collector after the individual MISRs are complete or even a collector that runs at the same time as the individual MISR collection. However the expect value 512 is different, thus harder to predict than the current XOR tree structure.

Figure 6A:
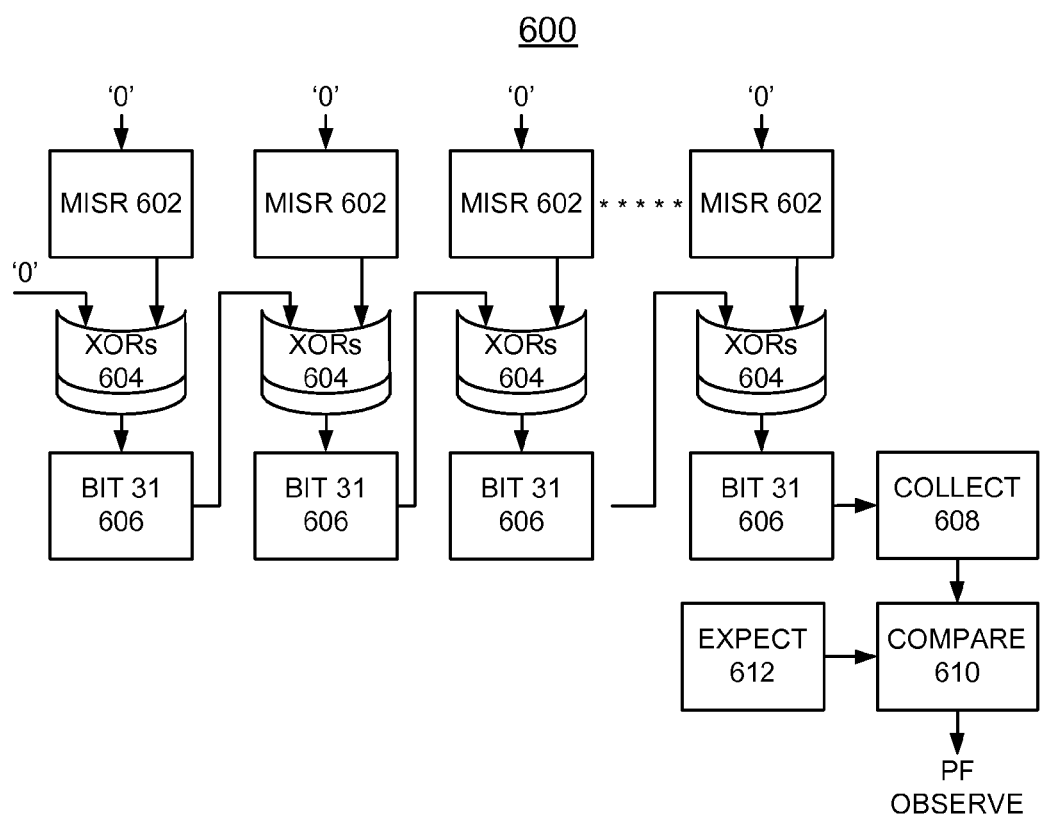

Referring to FIG. 6A, there is shown a MISR compression circuit generally designated by the reference character 600 in accordance with preferred embodiments. MISR compression circuit 600 includes a plurality of MISRs 602 each connected to a respective XOR 604 providing an output to a last bit or bit 31 block 606. The plurality of XORs 604 is connected in a chain of XORs with a first XOR 604 receiving a zero input, and the other XORs 604 receiving an input from the prior adjacent last bit or bit 31 block 606. MISR compression circuit 600 includes a collect 608 receiving an input from the last bit or bit 31 block 606 in the chain, a compare function 610 and an expect value 612. The collect 608 provides inputs to the compare function 610. As shown, MISR compression circuit 600 uses only the final bit of each MISR 602 as a pipe in the collection XOR tree. As such with n MISRs 602 the data is collected in n+31 cycles, and the wiring is much reduced, however both the expect and collect will be n+32 bits wide. The MISRs 602 will shift in 0s as their data is unloaded, simplifying results prediction. Alternatively the collect 608 can provide an XOR feed back like that in FIG. 3A reducing the size of the collect and expect. Or the collect could be eliminated altogether like in FIG. 2C and the serial data compared directly to the expect data for each serial shift cycle.

Figure 6B:
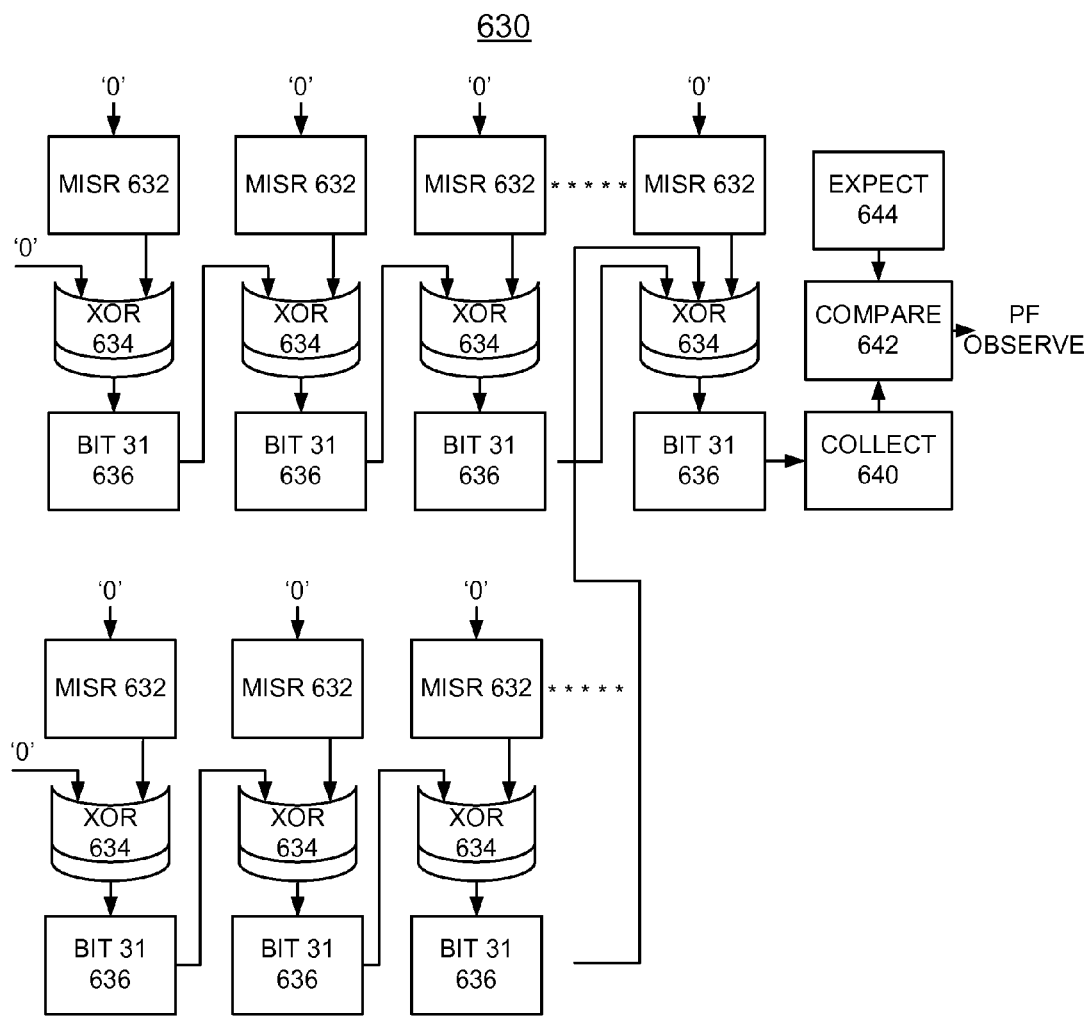

Referring to FIG. 6B, there is shown a MISR compression circuit generally designated by the reference character 630 in accordance with preferred embodiments. MISR compression circuit 630 includes a plurality of MISRs 632 divided into two sections, and each MISRs 632 is connected to a respective XOR 634 providing an output to a last bit or bit 31 block 636. The plurality of XORs 634 is connected in a chain of XORs with a first XOR 634 in the respective sections receiving a zero input, and the other XORs 604 receiving an input from the prior adjacent last bit or bit 31 block 636. MISR compression circuit 630 includes a collect 640 receiving an input from the last bit or bit 31 block 636 in the chain, a compare function 642 and an expect value 644. The collect 640 provides an input to the compare function 642. As shown, MISR compression circuit 630 is similar to MISR compression circuit 320 of FIG. 3B, allowing this same method to be implemented, and further reducing the collection cycles to the tree depth n plus 31. Also note that the alternative collection and comparison methods of FIG. 6A can be applied here as well.

In both MISR compression circuits 600, 630 the final result are very predictable with knowledge of the tree. In the MISR compression circuits 600 of FIG. 6A, the first bit is MISRn (31), the next is MISRn(30) XOR MISRn-1(31), and the next is MISRn(29) XOR MISRn-1(30) XOR MISRn-2(31). Like many of the MISR compression circuits, the collection register or collect 608, 640 can be a MISR, simple shift register, a single pass fail bit or simply fed to a chip pin with trade-offs mostly involving real estate and tester data. Also note that in MISR compression circuits 600, 630 the individual MISR results are destroyed when collected. This could be rectified by adding a pipe latch on every MISR 602, 632 and looping back each MISRs result and shifting an even multiple of 32 bits.

In cases of identical cores XORing results from passing MISRs could easily result in an all 0 result. If those same identical cores have an identical systematic failure the XORing would result again in an all 0 answer, masking the fails. In many of these methodologies it is recommended that the results be rotated before combining potentially identical MISRs. It should be understood that there is no single ideal solution. Each design advantageously selects one or a combination of these methods to meet their wiring, real estate and test time requirements. However common to all solutions of circuits 240, 300, 320, 400, 420, 430, 500, 600, and 630 is MISR-result compression to save test time and/or wiring.

Figure 7:
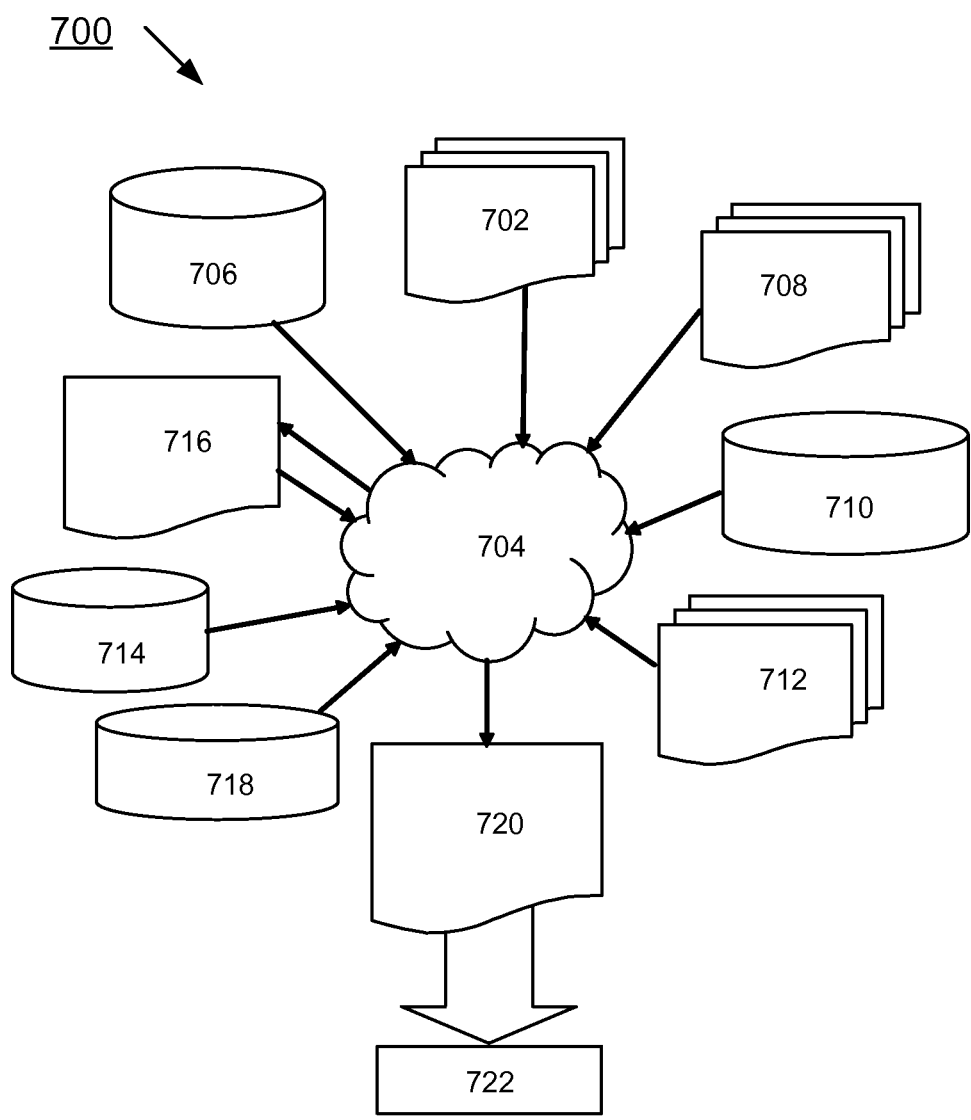
FIG. 7 is a flow diagram of a design process used in semiconductor design, manufacturing, and/or test.

FIG. 7 shows a block diagram of an example design flow 700. Design flow 700 may vary depending on the type of IC being designed. For example, a design flow 700 for building an application specific IC (ASIC) may differ from a design flow 700 for designing a standard component. Design structure 702 is preferably an input to a design process 704 and may come from an IP provider, a core developer, or other design company or may be generated by the operator of the design flow, or from other sources. Design structure 702 comprises circuits 240, 300, 320, 400, 420, 430, 500, 600, and 630 in the form of schematics or HDL, a hardware-description language, for example, Verilog, VHDL, C, and the like. Design structure 702 may be contained on one or more machine readable medium. For example, design structure 702 may be a text file or a graphical representation of circuits 240, 300, 320, 400, 420, 430, 500, 600, and 630. Design process 704 preferably synthesizes, or translates, circuits 240, 300, 320, 400, 420, 430, 500, 600, and 630 into a netlist 706, where netlist 706 is, for example, a list of wires, transistors, logic gates, control circuits, I/O, models, etc. that describes the connections to other elements and circuits in an integrated circuit design and recorded on at least one of machine readable medium. This may be an iterative process in which netlist 706 is resynthesized one or more times depending on design specifications and parameters for the circuit.

Design process 704 may include using a variety of inputs; for example, inputs from library elements 708 which may house a set of commonly used elements, circuits, and devices, including models, layouts, and symbolic representations, for a given manufacturing technology, such as different technology nodes, 32 nm, 45 nm, 70 nm, and the like, design specifications 710, characterization data 712, verification data 714, design rules 716, and test data files 718, which may include test patterns and other testing information. Design process 704 may further include, for example, standard circuit design processes such as timing analysis, verification, design rule checking, place and route operations, and the like. One of ordinary skill in the art of integrated circuit design can appreciate the extent of possible electronic design automation tools and applications used in design process 704 without deviating from the scope and spirit of the invention. The design structure of the invention is not limited to any specific design flow.

Design process 704 preferably translates an embodiment of the invention as shown in FIGS. 2C, 3A, 3B, 4A, 4B, 4C, 5, 6A and 6B along with any additional integrated circuit design or data (if applicable), into a second design structure 720. Design structure 720 resides on a storage medium in a data format used for the exchange of layout data of integrated circuits, for example, information stored in a GDSII (GDS2), GL1, OASIS, or any other suitable format for storing such design structures. Design structure 720 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 2C, 3A, 3B, 4A, 4B, 4C, 5, 6A and 6B. Design structure 720 may then proceed to a stage 722 where, for example, design structure 720 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A method for implementing multiple input signature register (MISR) compression for test time reduction, said method comprising:
  providing a plurality of first MISRs connected in series,
  providing a plurality of second MISRs connected in series,
  providing a compressor including a plurality of exclusive OR (XOR) blocks connected with said plurality of first and second MISRs to compress MISR data, each XOR block receiving one or more inputs from among said first and said second MISRs;

providing a collect block connected to said compressor, said collect block receiving inputs from at least one or more XOR blocks with one XOR block connected to said collect block and receiving feedback inputs from said collect block, and said compressor including an expect value coupled to a compare receiving an input from said collect block and providing a pass/fail test observe function.

2. The method as recited in claim 1 includes providing said compressor to compress MISR data at a scan cycle rate.

3. A circuit for implementing multiple input signature register (MISR) compression for test time reduction comprising:
   a plurality of first MISRs connected in series,
   a plurality of second MISRs connected in series, and
   a compressor including a plurality of exclusive OR (XOR) blocks connected with said plurality of first and second MISRs to compress MISR data, each XOR block receiving one or more inputs from among said first and said second MISRs;
   a collect block connected to said compressor,
   said collect block receiving inputs from at least one or more XOR blocks with one XOR block connected to said collect block and receiving feedback inputs from said collect block, and
   said compressor including an expect value coupled to a compare receiving an input from said collect block and providing a pass/fail test observe function.

4. The circuit as recited in claim 3 includes said collect block providing an input to said compressor.

5. The circuit as recited in claim 3 wherein said compressor is enabled to compress MISR data at a scan cycle rate.

6. A design structure embodied in a non-transitory machine readable storage medium used in a design process, the design structure comprising:
   a circuit tangibly embodied in the non-transitory machine readable storage medium used in the design process, said circuit for implementing multiple input signature register (MISR) compression for test time reduction, said circuit comprising:
   a plurality of first MISRs connected in series,
   a plurality of second MISRs connected in series, and
   a compressor including a plurality of exclusive OR (XOR) blocks connected with said plurality of first and second MISRs to compress MISR data, each XOR block receiving one or more inputs from among said first and said second MISRs;
   a collect block connected to said compressor,
   said collect block receiving inputs from at least one or more XOR blocks with one XOR block connected to said collect block and receiving feedback inputs from said collect block, and
   said compressor including an expect value coupled to a compare receiving an input from said collect block and providing a pass/fail test observe function, wherein the design structure, when read and used in the manufacture of a semiconductor chip produces a chip comprising said test circuit.

7. The design structure of claim 6, wherein the design structure comprises a netlist, which describes said circuit.

8. The design structure of claim 6, wherein the design structure resides on the non-transitory storage medium as a data format used for the exchange of layout data of integrated circuits.

9. The design structure of claim 6, wherein the design structure includes at least one of test data files, characterization data, verification data, or design specifications.

* * * * *